US006475888B1

United States Patent
Sohn

(10) Patent No.: US 6,475,888 B1
(45) Date of Patent: Nov. 5, 2002

(54) METHOD FOR FORMING ULTRA-SHALLOW JUNCTIONS USING LASER ANNEALING

(75) Inventor: Yong Sun Sohn, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/016,534

(22) Filed: Dec. 10, 2001

(30) Foreign Application Priority Data

Apr. 30, 2001 (KR) .......................... 2001-23403

(51) Int. Cl.[7] .............................................. H01L 21/26
(52) U.S. Cl. ......................................... 438/535; 438/550
(58) Field of Search ................................ 438/257, 535, 438/550, 565

(56) References Cited

U.S. PATENT DOCUMENTS

| | | | |
|---|---|---|---|
| 5,079,600 A | * 1/1992 | Schnur et al. | .................. 357/4 |
| 5,541,138 A | 7/1996 | Yamazaki et al. | |
| 5,569,615 A | 10/1996 | Yamazaki et al. | |
| 5,648,277 A | * 7/1997 | Zhang et al. | .................. 437/21 |
| 5,789,292 A | 8/1998 | Yamazaki et al. | |
| 5,882,991 A | 3/1999 | Paranjpe | |
| 5,965,915 A | 10/1999 | Yamazaki et al. | |
| 6,218,678 B1 | * 4/2001 | Zhang et la. | .................. 257/59 |
| 6,294,815 B1 | * 9/2001 | Yamazaki et al. | .......... 257/350 |

FOREIGN PATENT DOCUMENTS

| | | |
|---|---|---|
| JP | 154073 | 7/1986 |
| JP | 112778 | 5/1989 |
| JP | 204418 | 7/1994 |
| JP | 77680 | 3/2000 |

* cited by examiner

Primary Examiner—Olik Chaudhuri
Assistant Examiner—David S Blum
(74) Attorney, Agent, or Firm—Ladas & Parry

(57) ABSTRACT

A method for forming an ultra-shallow junction using laser annealing wherein an amorphous carbon layer is used as an energy absorber layer comprises the steps of preparing a silicon substrate having isolation layers; forming a gate having a stacked structure of a gate insulating layer, a polysilicon layer and a metal layer on the silicon substrate; forming a sacrificial spacer on the sidewalls of the gate; forming source and drain regions on the silicon substrate regions at both sides of the gate including on the sacrificial spacer; removing the sacrificial spacer; doping impurities to form source/drain extension doping layers on the silicon substrate regions at both sides of the gate; depositing sequentially a reaction preventing layer and an amorphous carbon layer as a laser absorber layer on the resulting structure; forming source/drain extension doping layers on inner sides of the source and drain regions by performing laser annealing in an atmosphere of inert gas or under vacuum; and removing the amorphous carbon layer.

26 Claims, 7 Drawing Sheets

METHOD FOR FORMING ULTRA-SHALLOW JUNCTIONS USING LASER ANNEALING

BACKGROUND OF THE INVENTION

1. Field of the Invention

The present invention relates generally to a method for fabricating semiconductor devices and, more particularly, to a method for forming ultra-shallow junctions using laser annealing with an amorphous carbon layer as an energy absorber layer.

2. Description of the Background Art

As a design rule for high performance semiconductor device is reduced, recent research and development efforts are focused on formation of ultra-shallow junction. Therefore, research and development are being in progress.

For example, in semiconductor devices having a gate length of less than 250 nm, that is, in MIS (Metal-Insulator-Semiconductor) transistors, source/drain extension (hereinafter, referred to as SDE) doping layers having ultra-shallow junctions are formed on inner sides of source/drain regions. In a conventional method, this SDE layer is formed by implanting impurity ions and performing a rapid thermal process (hereinafter referred to as RTP) and thereby, activating dopants in the SDE doping layer and source/drain regions The above-described method is advantageous in forming a transistor having gate lengths of more than 130 nm. However, it has several drawbacks when applied to high performance transistors having gate lengths of less than 100 nm.

First, when the high performance transistor is formed, it is required to maintain a junction depth of the SDE doping layer less than 35 nm. However, when junction depth of the SDE doping layer is less than 35 nm, a desired doping degree of the SDE doping layer is not maintained due to the solid solubility limit, thereby causing abrupt increase of sheet resistance. As a result, it is difficult to obtain a high performance transistor.

Therefore, laser thermal processes have been developed to solve the above problems.

FIG. 1 is a graph plotting sheet resistance versus junction depth in each method for forming ultra-shallow junctions, where reference code A indicates sheet resistance according to junction depths in which RTP is performed to activate doped impurities and reference code B indicates those in which laser annealing is performed. Reference code C indicates scaling rule requirements of junction depth and sheet resistance.

As shown in FIG. 1, when RTP is performed to activate impurities (A), scaling rule requirements of junction depth and sheet resistance are not fulfilled. However, when laser annealing is performed (B), they are fulfilled.

A fabrication method for making 70 nm MOSFET using laser annealing, as proposed by Bin Yu et al., will be described with reference to FIGS. 2A to 2C. (IEDM 1999, "70 nm MOSFET with Ultra-Shallow, Abrupt, and Super-Doped S/D Extension Implemented by Laser Thermal Process").

Referring to FIG. 2A, a gate 23 having a gate oxide film 22 is formed on an active region of silicon substrate 20 defined by a trench type isolation layer 21 through well-known processes. Then, a first spacer 24, made of silicon nitride layer ($Si_3N_4$), is formed on the sidewalls of the gate 23. An ion implantation process and a rapid thermal process are sequentially performed to form source/drain regions 25a and 25b on the silicon substrate 20 at both sides of gate 23, including the first spacer 24.

Referring to FIG. 2B, the first spacer 24 is removed and ions are implanted on the resulting structure to form a SDE doping layer. Then, laser annealing is performed to selectively melt and solidify the amorphous surfaces of source/drain regions 25a and 25b, thereby forming a SDE doping layer 26, activated in high concentration on silicon substrate 20 at both sides of gate 23.

Referring to FIG. 2C, a second spacer 27 is formed on sidewalls of gate 23 by oxide film deposition and blanket etching and then a metal layer, for example, a cobalt layer is deposited to a predetermined thickness on the resulting structure. Then, annealing is performed so that cobalt of the cobalt layer may respond to substrate silicon, thereby forming a cobalt silicide layer 28 on the surface of source/drain regions 25a and 25b and on the upper surface of the gate 23.

Ken-ichi Goto proposed a method that the activated dopant concentration of a contact formation region can be maintained at greater than $10^{21}/cm^3$ by using laser annealing after implanting the source/drain ions to improve contact resistance. The ultra-low resistance contact formation method by laser annealing will be described with reference to FIGS. 3A to 3C. (IEDM 1999, "Ultra-Low Contact Resistance for Deca-nm MOSFETs by Laser Annealing").

Referring to FIG. 3A, a gate 33 having a gate oxide film 32 is formed on an active region of silicon substrate 30 defined by isolation layer 31. And, ions are implanted to form source/drain extension doping layer and rapid thermal treatment is performed thereby, forming a SDE doping layer 34 electrically activated on the surface of substrate 30 at both sides of the gate 33.

Referring to FIG. 3B, a spacer 35 is formed on sidewalls of gate 33 and ions are implanted, thereby forming inactivated doping layer 36 to form source/drain regions on a silicon substrate 30 at both sides of gate including the spacer 35.

Referring to FIG. 3C, in order to obtain ultra-low resistance contact, source/drain regions 36a and 36b are formed using laser annealing and, at the same time, the surface of the source/drain regions 36a and 36b and the upper surface of gate 33 are transformed into an activated doping layer 37 in a high concentration.

Thereafter, a rapid thermal treatment at a low temperature of 800° C. and interconnection process are performed to complete the formation of the transistor.

The above-mentioned method using laser annealing is advantageous to fabrication of a transistor having a silicon gate. However, as shown in FIG. 4, it is difficult to apply to fabrication of a transistor having a metal gate 42d on the upper part of a gate 42, since the metal gate 42d is transformed during laser annealing due to the fact that the metal gate 42d has high laser absorption rate. In FIG. 4, reference numeral 40 indicates a silicon substrate, reference numeral 41 is a isolation layer, reference numeral 42a is a gate insulating layer, reference numeral 42b is a silicon gate, reference numeral 42c is a diffusion preventing layer, reference numeral 43a is a source region, reference numeral 43b is a drain region and reference numeral 44 is a SDE doping layer.

In order to solve the above-described problems, a method has been developed that includes a step prior to laser annealing, in that a metal laser absorber layer, for example, a refractory metal thin film such as a Ti/TiN layer, is deposited on the surface of the substrate, thereby preventing an excessive rise in temperature of the metal gate. However, problems exist in that the melting point of Ti is 1,667° C., very similar to that of Si, 1,412° C. Therefore, the Ti components remain in the oxide film after the Ti/TiN layer is removed.

SUMMARY OF THE INVENTION

Therefore, an object of the present invention is to provide a method for forming an ultra-shallow junction capable of preventing transformation of a metal gate using laser annealing.

Another object of the present invention is to provide a method for forming an ultra-shallow junction using laser annealing to be applied to fabrication of a high performance device without transformation of the gate.

In order to achieve the above-described objects, an embodiment of the present invention comprises the steps of: preparing a silicon substrate having isolation layers thereon; forming a gate which has a stacked structure of a gate insulating layer, a polysilicon layer and a metal layer on the silicon substrate; forming a sacrificial spacer on sidewalls of the gate; forming source/drain regions on the silicon substrate region at both sides of the gate including over the sacrificial spacer; removing the sacrificial spacer; doping impurities to form a source/drain extension doping layer on the silicon substrate at both sides of the gate; depositing a reaction preventing layer and an amorphous carbon layer as a laser absorber layer on the resulting structure; forming source/drain extension doping layers on inner sides of the source/drain regions by laser annealing; and removing the amorphous carbon layer.

Another embodiment of the present invention comprises the steps of: preparing a silicon substrate having trench type isolation layers to define an active region; forming a gate having a stacked structure of a gate insulating layer, a polysilicon layer, a diffusion preventing layer, a metal layer and a hard mask layer on an active region of the silicon substrate; forming a thin oxide layer on the surface of the silicon substrate and the side of the polysilicon layer by performing oxidation processes; depositing a thin silicon nitride layer as an etching preventing layer on the resulting structure; forming a sacrificial spacer on the sidewalls of the gate on which the silicon nitride layer is deposited; forming source/drain regions on the silicon substrate region at both sides of gate including the sacrificial spacer; removing the sacrificial spacer, the silicon nitride layer and the oxide layer formed on the surface of the silicon substrate; doping impurities in low energy to form source/drain extension doping layers on the silicon substrate at both sides of the gate; depositing a silicon oxide layer as a reaction preventing layer and an amorphous carbon layer as a laser absorber layer on the resulting structure; forming source/drain extension doping layers on inner sides of the source and drain regions by performing laser annealing; and removing the amorphous carbon layer using an $O_2$ plasma etching process.

Still another embodiment of the present invention comprises the steps of: preparing a silicon substrate having isolation layers thereon; forming a gate having a stacked structure of a gate insulating layer, a polysilicon layer and a metal layer on the silicon substrate; forming source/drain extension doping layers on silicon substrates at both sides of the gate; forming a spacer on the sidewalls of the gate; doping impurities on the silicon substrate at both sides of the gate including the spacer to form source/drain regions; depositing a reaction preventing layer and an amorphous carbon layer as an energy absorber layer on the resulting structure; forming source and drain regions on the silicon substrate regions at both sides of gate including the spacer by using laser annealing; and removing the amorphous carbon layer.

Still another embodiment of the present invention comprises the steps of: preparing a silicon substrate having trench type isolation layers thereon to define an active region; forming a gate having a stacked structure of a gate insulating layer, a polysilicon layer, a diffusion preventing layer, a metal layer and a hard mask layer; forming source/drain extension doping layers by doping impurities and rapid thermal treatment on the silicon substrate region at both sides of the gate; depositing a thin silicon nitride layer as an etching preventing layer on the resulting structure; forming a spacer on sidewalls of the gate having the silicon nitride layer thereon; doping impurities to form source and drain regions on the silicon substrate at both sides of gate including the spacer; depositing a silicon oxide layer as a reaction preventing layer and an amorphous carbon layer as an energy absorber layer on the resulting structure; forming source and drain regions on the silicon substrate at both sides of the gate including the spacer using laser annealing; and removing the amorphous carbon layer by using an $O_2$ plasma etching process.

The objects and features of the invention may be understood with reference to the following detailed description of several illustrative embodiments of the invention, taken together with the illustrations in the accompanying drawings.

DETAILED DESCRIPTION OF THE INVENTION

FIGS. 5A to 5E are cross-sectional views for showing a method for forming an ultra-shallow junction using laser annealing according to an embodiment of the present invention.

Figure 1:
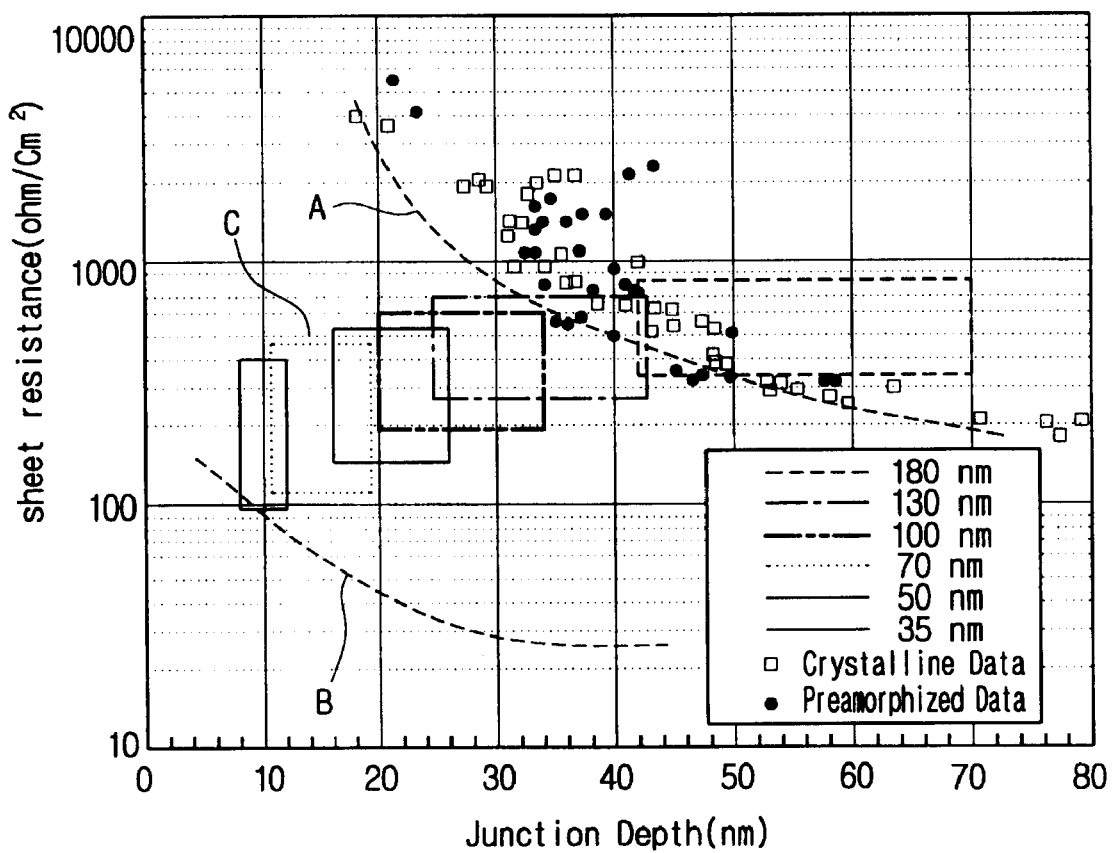
FIG. 1 is a graph for showing sheet resistance according to junction depth in each method for forming an ultra-shallow junction.
Figure 2A:
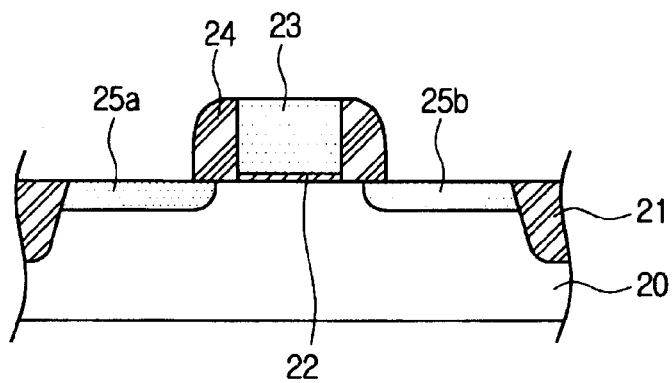
FIGS. 2A to 2C are cross-sectional views for showing a conventional method for forming an ultra-shallow junction.
Figure 2B:
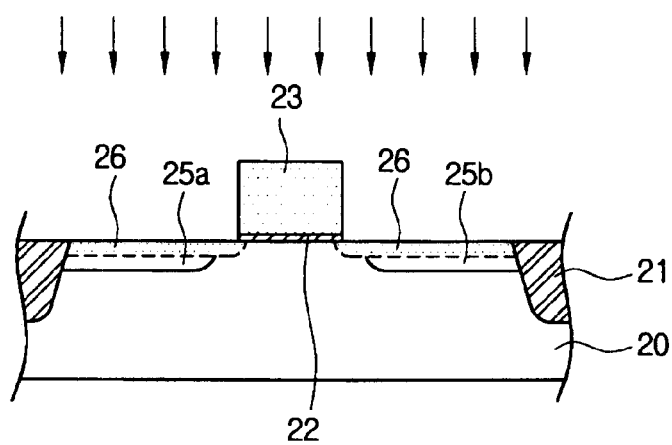
Figure 2C:
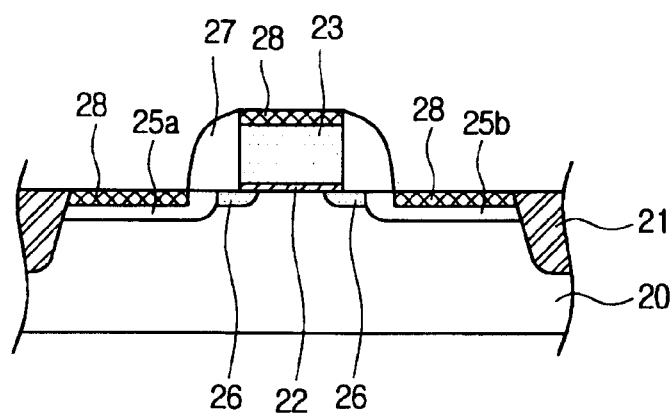
Figure 3A:
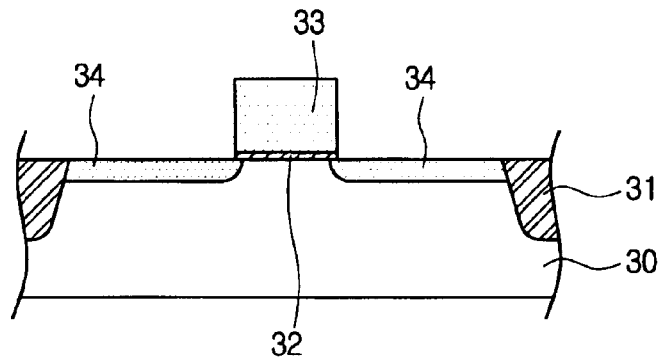
FIGS. 3A to 3C are cross-sectional views for showing another conventional method for forming an ultra-shallow junction.
Figure 3B:
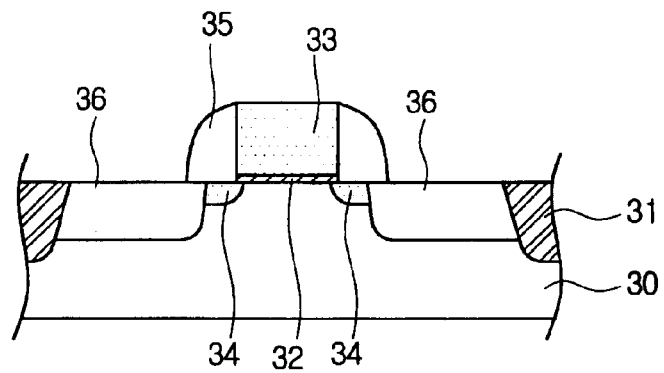
Figure 3C:
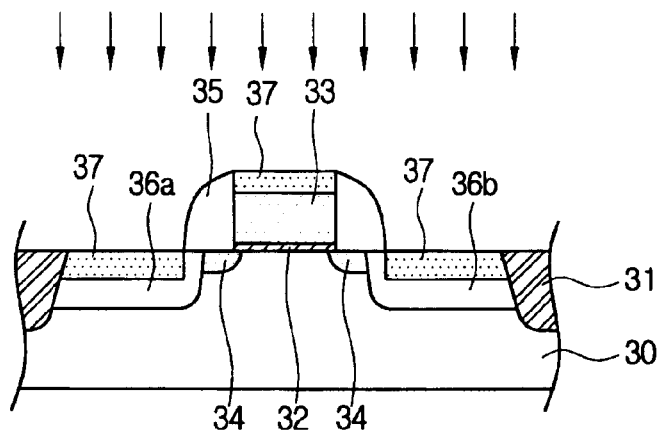
Figure 4:
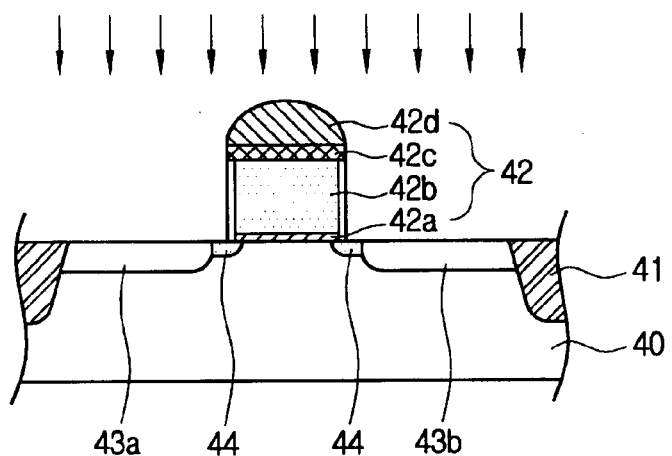
FIG. 4 is a cross-sectional view for showing problems of conventional method for forming an ultra-shallow junction.
Figure 5A:
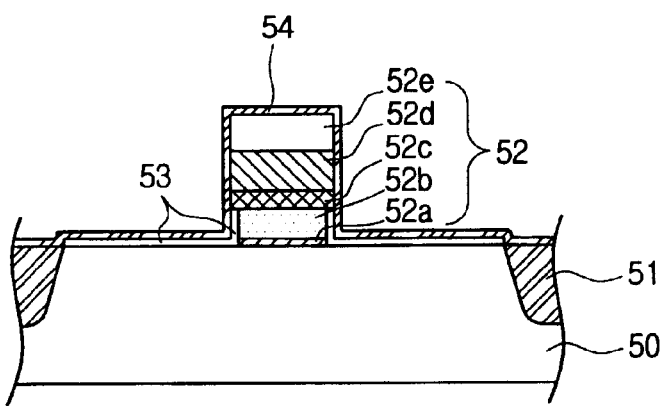
FIGS. 5A to 5E are cross-sectional views for showing a method for forming an ultra-shallow junction according to an embodiment of the present invention.

Referring to FIG. 5A, a trench type isolation layer 51 is formed on a silicon substrate 50 to define a field region and an active region, and an N-well and a P-well (not shown) are formed by well-known processes. A gate insulating layer 52a, a polysilicon layer 52b, a diffusion preventing layer 52c, a gate metal layer 52d, and a hard mask layer 52e are sequentially formed on the silicon substrate 50. Then, the layers are patterned through well-known photolithography processes, thereby forming a gate 52 having a stacked structure of the polysilicon layer 52b, the diffusion preventing layer 52c, and the metal layer 52d, on the active region of the silicon substrate 50.

Subsequently, selective oxidation processes are performed to recover etching damage generated in forming the gate 52. As a result, oxide layers 53 are formed on the surface of silicon substrate 50 and on the side of polysilicon layer 52a. A thin silicon nitride layer 54 is deposited on the resulting structure to be used as an etching preventing layer in the succeeding process for removing spacer.

Figure 5B:
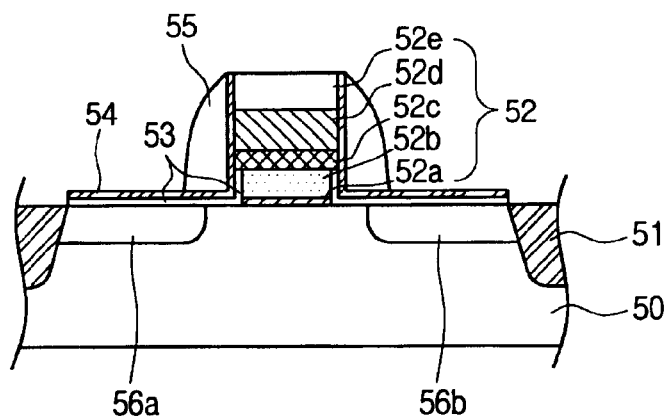

Referring to FIG. 5B, an oxide layer is deposited on the silicon nitride layer 54 and the oxide layer is subjected to an anisotropy etching process, thereby forming a spacer 55 on the sidewalls of gate 52 having the silicon nitride layer 54 thereon. Then, N type or P type impurity ions are implanted or doped by plasma doping on silicon substrate 50 at both sides of gate 52 including the spacer 55 and rapid thermal treatment is performed to form source and drain regions 56a, and 56b.

Figure 5C:
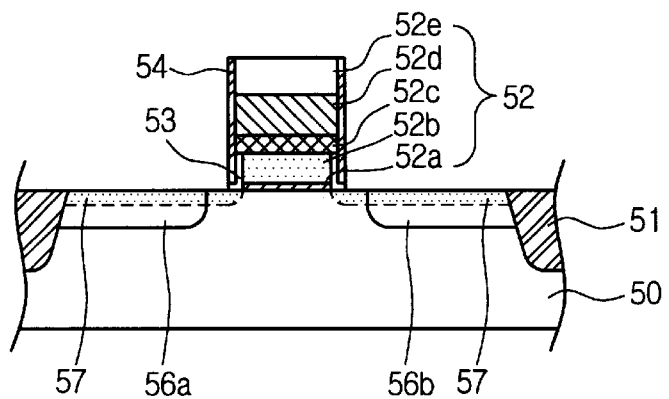

Referring to FIG. 5C, the spacer is removed by selective etching process using HF solution and the silicon nitride layer 54 as an etching preventing layer. Then, the silicon nitride layer 54 and oxide layer 53 formed on the silicon substrate 50 are removed by an anisotropy etching process. Subsequently, N type or P type impurity ions are implanted in low energy or doped by plasma doping to form SDE doping layers on the silicon substrate 50 at both sides of gate 52. Here, reference code 57 indicates an inactivated doping layer.

Figure 5D:
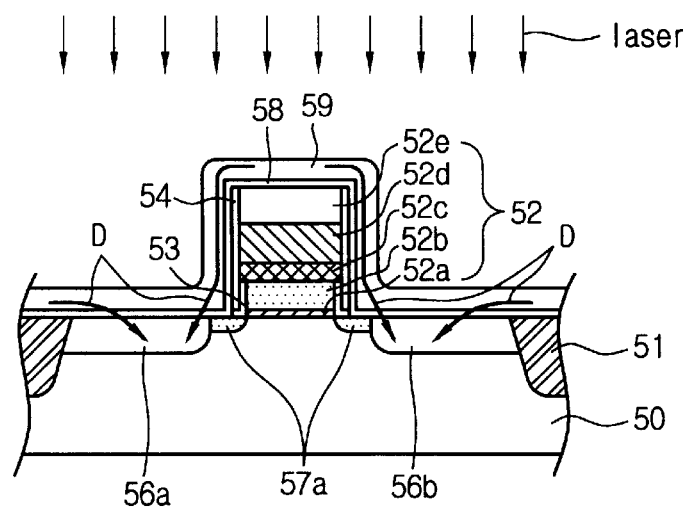

Referring to FIG. 5D, a reaction preventing layer 58 made of a silicon oxide layer is deposited on the resulting structure. An amorphous carbon layer 59 (Graphite) is deposited to a thickness of 200 to 400 Å as a laser absorber layer on the reaction preventing layer 58. Then, laser annealing is performed in an atmosphere of inactive gas and under vacuum, thereby the inactivated doping layer is activated in a high concentration. As a result, SDE doping layer 57a, is formed on inner sides of source and drain regions 56a, and 56b. Arrows D indicates a path by which energy absorbed in the amorphous carbon 59 is transferred to the lower structure and to the silicon substrate 50. During laser annealing, the amorphous carbon layer 59 absorbs laser energy and the absorbed energy is transferred to the lower structure, thereby activating dopants. Therefore, the metal layer 52d, is not transformed at the gate 52.

Figure 5E:
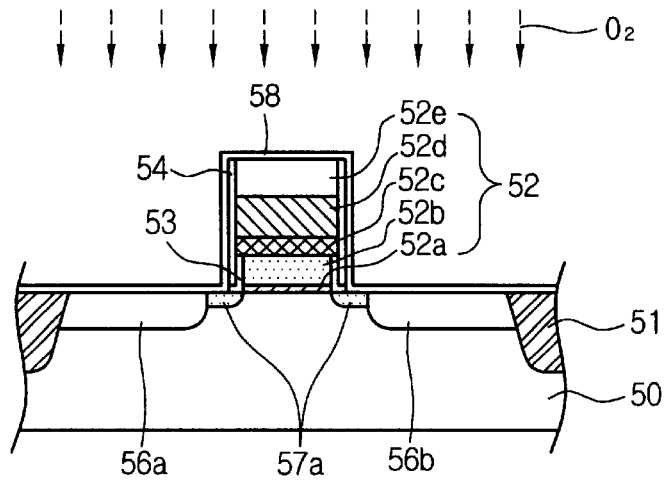

Referring to FIG. 5E, the amorphous carbon layer used as a laser absorber layer is removed by an $O_2$, plasma etching process.

Thereafter, by performing well-known processes, for example, a spacer formation process, an interlayer insulating layer formation process, a contact formation process and an interconnection process, a MOSFET device having an ultra-shallow junction is obtained with a gate length of less than 100 nm.

In the method for forming an ultra-shallow junction using laser annealing according to the present invention, the amorphous carbon layer is desirable for a laser absorber layer because it has a very high melting point, approximately 3,800° C. and in laser annealing, has a diffusion length of 0.02 Å in silicon.

In short, the laser absorber layer should meet several requirements. First, it should have a high laser absorption rate. Second, the melting point and the sublimation point thereof should be higher than the maximum temperature in laser annealing, for example, 1,300° C. Third, it should have no reaction with a reaction preventing layer, that is, the silicon oxide layer during laser annealing and it should be prevented from diffusing into the silicon oxide layer. Finally, when it is removed, it should have a high selective ratio to a lower structure and be capable of easy removal.

As a result, the amorphous carbon layer is desirable for a laser absorber layer in that it has a high laser absorption rate and a high melting point, approximately 3,800° C. Moreover, it has minimal reaction with the silicon oxide layer during short duration laser annealing of several nanoseconds (ns) and can be easily removed by $O_2$, plasma etching.

It is expected that carbon may react with the oxygen in the silicon oxide layer during annealing. However, in laser annealing, the temperature of the amorphous carbon layer is about 1,200° C. for several ns and then is decreased to a lower temperature below 200° C. for 300 ns, resulting in minimal reaction between the carbon and the oxygen. In order to completely prevent a reaction between carbon and oxygen, the surface of the silicon oxide layer can be nitrified.

FIGS. 6A to 6E are cross-sectional views for showing a method for forming an ultra-shallow junction using laser annealing according to another embodiment of the present invention.

Figure 6A:
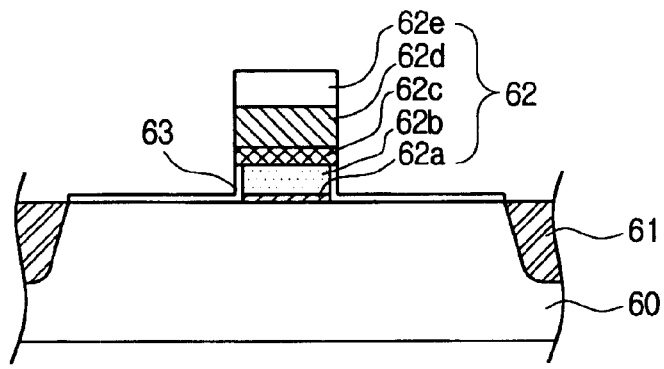
FIGS. 6A to 6E are cross-sectional views for showing a method for forming ultra-shallow junction according to another embodiment of the present invention.

Referring to FIG. 6A, a trench type isolation layer 61 is formed on a silicon substrate 60 to define a field region and an active region, and an N-well and a P-well (not shown) are formed through well-known processes. A gate insulating layer 62a, a polysilicon layer 62b, a diffusion preventing layer 62c, a metal layer for gate 62d, and a hard mask layer 62e are sequentially formed on the silicon substrate 60. Then, the layers are patterned by well-known photolithography processes, thereby forming a gate 62 having a stacked structure on the active region of the silicon substrate 60. Sequentially, a selective oxidation process is performed to recover etching damage generated in forming the gate 62, therefore an oxide film 63 is formed on the surface of silicon substrate 60 and on the side of polysilicon layer 62a.

Figure 6B:
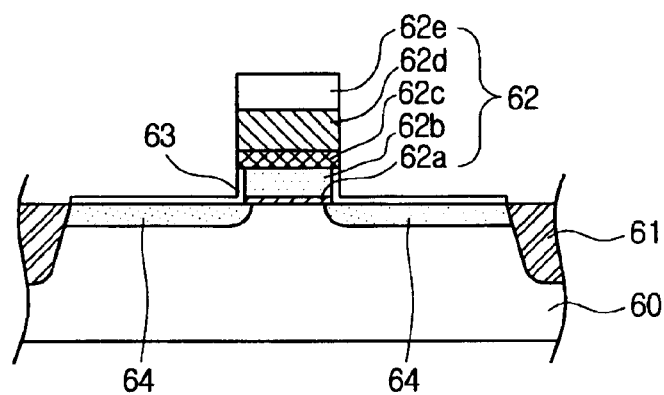

Referring to FIG. 6B, N type or P type impurity ions are implanted or doped by plasma doping, and then a rapid thermal treatment is performed to form SDE doping layers 64 on the surface of the silicon substrate 60 at both sides of the gate 62.

Figure 6C:
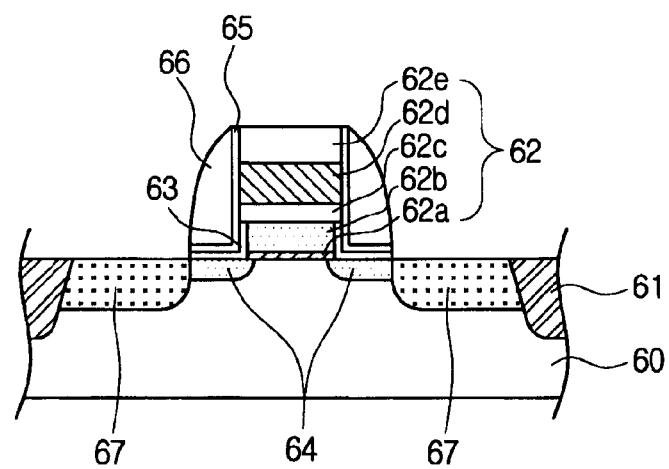

Referring to FIG. 6C, a silicon nitride layer 65 is deposited at a thin thickness as an etching preventing layer on the resulting structure and a spacer 66 is formed by oxide layer deposition and anisotropy etching on sidewall of gate 62 having the silicon nitride layer 65 thereon. Here, the silicon nitride layer 65 deposited on the silicon substrate 60 and the gate 62 are removed. Then, N type or P type impurity ions are implanted or doped by plasma doping in order to form source and drain regions on the silicon substrate 60 at both sides of gate 62 including the spacer 66. Reference numeral 67 indicates an inactivated doping layer.

Figure 6D:
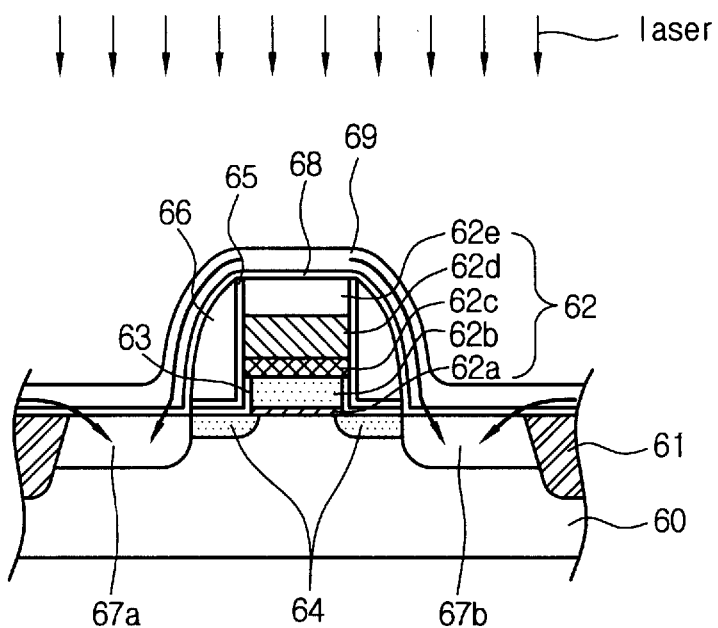

Referring to FIG. 6D, a reaction preventing layer 68 made of a silicon oxide layer is deposited on the resulting structure and an amorphous carbon layer 69 is deposited as a laser absorber layer on the reaction preventing layer 68. Then, source/drain regions 67a, and 67b, activated in a high concentration are formed on silicon substrate 60 at both sides of gate 62 including the spacer 66 by performing laser annealing in an atmosphere of inactive gas and under vacuum.

Figure 6E:
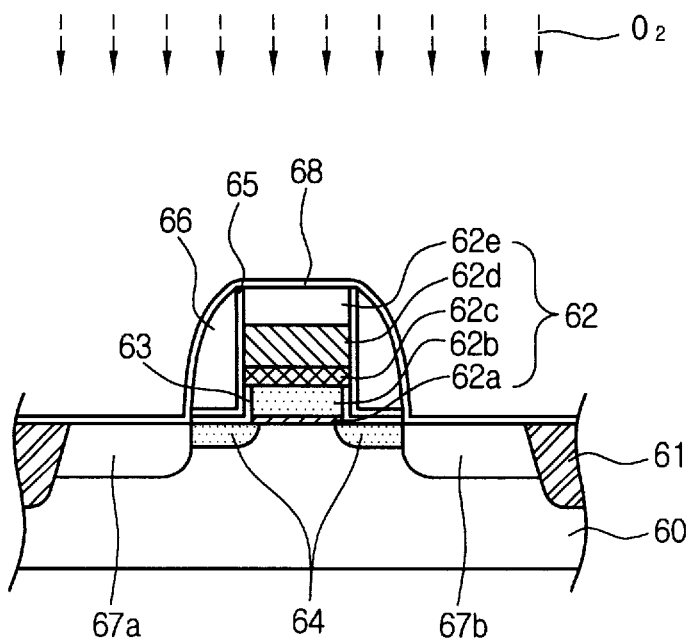

Referring to FIG. 6E, the amorphous carbon layer used as a laser absorber layer is removed by $O_2$, plasma etching.

Thereafter, well-known succeeding processes are performed to form a MOSFET device having an ultra-shallow junction with a gate length of less than 100 nm.

According to this embodiment, an amorphous carbon layer is used as a laser absorber layer, thereby preventing transformation of the metal layer of the gate during laser annealing. Additionally, the problem of remaining metal ions has been solved, and as a result, it is possible to fabricate a high performance device.

As described above, according to the present invention, during laser annealing, transformation of the metal gate is prevented since an amorphous carbon layer is used as a laser absorber layer.

Use of the present inventive method embodiments can solve the problems of remaining metal ions in removing the laser absorber layer since an amorphous carbon layer is used as a laser absorber layer.

Moreover, according to the present invention, yield has increased since a laser absorber layer is easily removed by $O_2$, plasma etching.

As a result, the present invention can be advantageously applied to the fabrication of high performance devices.

The invention may be embodied in other specific forms without departing from the spirit or essential characteristics described and illustrated herein. The present embodiment is therefore to be considered in all respects as illustrative and not restrictive. Any changes or modifications which come within the meaning and range of the following claims and equivalents thereof are therefore intended to be embraced thereby.

What is claimed is:

1. A method for forming an ultra-shallow junction using laser annealing comprising the steps of:
    preparing a silicon substrate having isolation layers;
    forming a gate having a stacked structure of a gate insulating layer, a polysilicon layer and a metal layer on the silicon substrate;
    forming a sacrificial spacer on the sidewalls of the gate;
    forming source and drain regions on the silicon substrate regions at both sides of the gate, including on the sacrificial spacer;
    removing the sacrificial spacer;
    doping impurities to form a source/drain extension doping layer on the silicon substrate regions at both sides of the gate;
    depositing sequentially a reaction preventing layer and an amorphous carbon layer as a laser absorber layer on the resulting structure
    forming source/drain extension doping layers on inner sides of the source and drain regions by performing laser annealing in an atmosphere of essentially inert gas or under vacuum; and
    removing the amorphous carbon layer.

2. The method for forming an ultra-shallow junction using laser annealing according to claim 1, wherein after the formation of the gate and before the formation of the sacrificial spacer, a thin oxide film is formed on the side of the polysilicon layer by performing selective oxidation processes and a silicon nitride layer is deposited as an etching preventing layer on the resulting structure.

3. The method for forming an ultra-shallow junction using laser annealing according to claim 1, wherein the step for formation of the source and drain regions comprises doping of N type or P type dopants on the silicon substrate at both sides of the g at e and performing a rapid thermal treatment.

4. The method f or forming an ultra-shallow junction using laser annealing according to claim 1, wherein the sacrificial spacer is removed by performing an etching process using HF solution.

5. The method for forming an ultra-shallow junction using laser annealing according to claim 2, wherein after the sacrificial spacer is removed and before impurities are doped to form the source/drain extension doping layers, the silicon nitride layer formed on the silicon substrate is removed.

6. The method for forming an ultra-shallow junction using laser annealing according to claim 5, wherein the silicon nitride layer is removed using an anisotropy etching process.

7. The method for forming an ultra-shallow junction using laser annealing according to claim 1, wherein the step for doping impurities to form the source/drain extension doping layers comprises ion-implantation of N type or P type dopants in low energy or plasma doping.

8. The method for forming an ultra-shallow junction using laser annealing according to claim 1, herein the reaction preventing layer is a silicon oxide layer.

9. The method for forming an ultra-shallow junction using laser annealing according to claim 1, wherein the amorphous carbon layer is deposited to a thickness of 200 to 400Å.

10. The method for forming an ultra-shallow junction using laser annealing according to claim 1, wherein the amorphous carbon layer is removed by etching process using $O_2$, plasma.

11. The method for forming an ultra-shallow junction using laser annealing comprising the steps of:
    preparing a silicon substrate having trench type isolation layers to define an active region;
    forming a gate having a stacked structure of a gate insulating layer, a polysilicon layer, a diffusion preventing layer, a metal layer and a hard mask layer on the active region of silicon substrate;
    forming a thin oxide layer on the surface of the silicon substrate and on side of polysilicon layer by performing selective oxidation processes; depositing a thin silicon nitride layer as an etching preventing layer on the resulting structure;
    forming a sacrificial spacer on sidewall of gate having the silicon nitride layer thereon;
    forming source/drain regions on the silicon substrate at both sides of gate including the sacrificial spacer;
    removing the sacrificial spacer, the silicon nitride layer and the oxide layer formed on the surface of the silicon substrate;
    doping impurities in low energy to form source/drain extension doping layers on the silicon substrate at both sides of the gate;
    depositing a silicon oxide layer as a reaction preventing layer and an amorphous carbon layer as a laser absorber layer on the resulting structure;
    forming source/drain extension doping layers on inner sides of the source and drain regions by performing laser annealing in an atmosphere of inert gas or under vacuum; and
    removing the amorphous carbon layer using an $O_2$, plasma etching process.

12. The method for forming an ultra-shallow junction using laser annealing according to claim 11, wherein the sacrificial spacer is removed by an etching process using HF solution and the silicon nitride layer is removed by an anisotropy etching process.

13. The method for forming an ultra-shallow junction using laser annealing according to claim 11, wherein the step for doping impurities to form the source/drain extension doping layers comprises ion implantation of N type or P type dopants in low energy or plasma doping.

14. The method for forming an ultra-shallow junction using laser annealing according to claim 11, wherein the amorphous carbon layer is deposited to a thickness of 200 to 400Å.

15. A method for forming an ultra-shallow junction using laser annealing comprising the steps of:
   preparing a silicon substrate having isolation layers thereon;
   forming a gate having a stacked structure of a gate insulating layer, a polysilicon layer and a metal layer on the silicon substrate;
   forming source/drain extension doping layers on the silicon substrate regions at both sides of the gate;
   forming a spacer on sidewalls of the gate;
   doping impurities on the silicon substrate at both sides of the gate including the spacer to form source and drain regions;
   depositing a reaction preventing layer and an amorphous carbon layer as an energy absorber layer on the resulting structure;
   forming source and drain regions on the silicon substrate at both sides of gate including the spacer by performing a laser annealing in an atmosphere of inert gas or under vacuum; and
   removing the amorphous carbon layer.

16. The method for forming an ultra-shallow junction using laser annealing according to claim 15, wherein after the formation of the gate and before the formation of the source/drain extension doping layers, thin oxide layers are formed on the surface of the silicon substrate and on sidewall of the polysilicon layer by performing selective oxidation processes.

17. The method for forming an ultra-shallow junction using laser annealing according to claim 15, wherein after formation of the source/drain extension doping layers and before formation of the spacer, a silicon nitride layer is deposited as an etching preventing layer on the resulting structure.

18. The method for forming an ultra-shallow junction using laser annealing according to claim 17, wherein in the formation of the spacer, the silicon nitride layer formed on the surface of the silicon substrate is removed.

19. The method for forming an ultra-shallow junction using laser annealing according to claim 15, wherein the formation of the source/drain extension doping layers comprises ion implantation of N type or P type dopants in low energy or plasma doping on the silicon substrate at both sides of the gate and performing a rapid thermal treatment.

20. The method for forming an ultra-shallow junction using laser annealing according to claim 15, wherein the reaction preventing layer is a silicon oxide layer.

21. The method for forming an ultra-shallow junction using laser annealing according to claim 15, wherein the amorphous carbon layer is deposited to a thickness of 200 to 400Å.

22. The method for forming an ultra-shallow junction using laser annealing according to claim 15, wherein the amorphous carbon layer is removed by an etching process using $O_2$, plasma.

23. A method for forming an ultra-shallow junction using laser annealing comprising the steps of:
   preparing a silicon substrate having trench type isolation layers to define an active region;
   forming a gate having a stacked structure of a gate insulating layer, a polysilicon layer, a diffusion preventing layer, a metal layer and a hard mask layer on the active region of the silicon substrate;
   forming source/drain extension doping layer by doping impurities on silicon substrate at both sides of the gate and by performing a rapid thermal treatment;
   depositing a thin silicon nitride layer as an etching preventing layer on the resulting structure;
   forming a spacer on sidewall of the gate and on the silicon nitride layer deposited thereon;
   doping impurities to form source and drain regions on the silicon substrate at both sides of the gate including the spacer;
   depositing a silicon oxide layer as a reaction preventing layer and an amorphous carbon layer as an energy absorber layer on the resulting structure;
   forming source and drain regions on the silicon substrate at both sides of the gate including the spacer by performing laser annealing in an atmosphere of inert gas or under vacuum; and
   removing the amorphous carbon layer using $O_2$, plasma etching.

24. The method for forming an ultra-shallow junction using laser annealing according to claim 23, wherein after the formation of the gate and before the formation of the source/drain extension doping layers, thin oxide layers are formed on the surface of the silicon substrate and on the sidewalls of the polysilicon layer by selective oxidation processes.

25. The method for forming an ultra-shallow junction using laser annealing according to claim 24, wherein in the formation of the spacer, the silicon nitride formed on the surface of the silicon substrate is removed.

26. The method for forming an ultra-shallow junction using laser annealing according to claim 24, wherein the amorphous carbon layer is deposited to a thickness of 200 to 400Å.

* * * * *